(12) United States Patent
Zhang et al.

(10) Patent No.: US 11,619,683 B2
(45) Date of Patent: Apr. 4, 2023

(54) METHOD FOR COMPENSATING FOR AN INFLUENCE OF A MAGNETIC INTERFERENCE SOURCE ON A MEASUREMENT OF A MAGNETIC FIELD SENSOR IN A DEVICE AND A DEVICE

(71) Applicant: Robert Bosch GmbH, Stuttgart (DE)

(72) Inventors: Rui Zhang, Wannweil (DE);
Sudhakaran Sreepad, Kannur (IN);
Parambath Muhammad, Kozhikode (IN)

(73) Assignee: ROBERT BOSCH GMBH, Stuttgart (DE)

( * ) Notice: Subject to any disclaimer, the term of this patent is extended or adjusted under 35 U.S.C. 154(b) by 9 days.

(21) Appl. No.: 17/456,120

(22) Filed: Nov. 22, 2021

(65) Prior Publication Data

US 2022/0170999 A1 Jun. 2, 2022

(30) Foreign Application Priority Data

Nov. 30, 2020 (DE) .................... 10 2020 215 043.5

(51) Int. Cl.
*G01R 33/00* (2006.01)
*H04R 1/10* (2006.01)
*G01R 33/02* (2006.01)

(52) U.S. Cl.
CPC ..... *G01R 33/0017* (2013.01); *G01R 33/0082* (2013.01); *G01R 33/0206* (2013.01); *H04R 1/1041* (2013.01)

(58) Field of Classification Search
CPC combination set(s) only.
See application file for complete search history.

(56) References Cited

U.S. PATENT DOCUMENTS

2006/0093174 A1* 5/2006 Niederdrank ........ H04R 25/554
381/317
2008/0126062 A1* 5/2008 Nikles .................. H04R 25/652
703/14

(Continued)

FOREIGN PATENT DOCUMENTS

DE 102009007233 A1 8/2010
DE 102013222097 A1 4/2015
EP 3410075 A1 12/2018

*Primary Examiner* — Alvaro E Fortich
(74) *Attorney, Agent, or Firm* — Norton Rose Fulbright US LLP; Gerard Messina (57) ABSTRACT

A method and device for compensating for an influence of a magnetic interference source on a measurement of a magnetic field sensor in a device. In the method, a magnetic flux density $M_1$ measured with the magnetic field sensor at a measured ambient temperature $T_k$ is compensated for with a compensation factor $M_{interference}$ of the magnetic interference source according to

$$M = M_1 - M_{interference},$$

where $$M_{interference} = M_0 + aM_0(T'_k - T_0)$$

and $M_0$ is a magnetic reference flux density relative to a reference temperature $T_0$, a corresponding to a material parameter, which is defined for a used magnet material of the magnetic interference source, and the measured ambient temperature $T_k$ being corrected using a non-linear delay parameter to a temperature of the magnetic interference source $T'_k$. The method is used for the axis-based compensation of a temperature drift, the material parameter a being determined individually for each Cartesian axis.

9 Claims, 4 Drawing Sheets

(56) References Cited

U.S. PATENT DOCUMENTS

| | | | |
|---|---|---|---|
| 2010/0195857 A1* | 8/2010 | Gebhardt | H04R 25/554 381/317 |
| 2011/0153233 A1* | 6/2011 | Grenet | G01R 33/0206 702/57 |
| 2015/0022188 A1* | 1/2015 | Daubert | G01R 33/07 324/207.12 |

* cited by examiner

METHOD FOR COMPENSATING FOR AN INFLUENCE OF A MAGNETIC INTERFERENCE SOURCE ON A MEASUREMENT OF A MAGNETIC FIELD SENSOR IN A DEVICE AND A DEVICE

CROSS REFERENCE

The present application claims the benefit under 35 U.S.C. § 119 of German Patent Application No. DE 102020215043.5 filed on Nov. 30, 2020, which is expressly incorporated herein by reference in its entirety.

FIELD

The present invention relates to a method for compensating for an influence of a magnetic interference source on a measurement of a magnetic field sensor in a device and an associated device.

BACKGROUND INFORMATION

A hearing device with an interference compensation and a method for designing the hearing device are described in German Patent Application No. DE 10 2009 007 233 A1. In this method, magnetic compensation components are introduced into the magnetic field of the hearing device for reducing the interference coupling by external magnetic interference sources into the receiving antenna of the hearing device.

SUMMARY

It is an object of the present invention to specify an improved method for compensating for an influence of a magnetic interference source on a measurement of a magnetic field sensor in a device, and an optimized device.

This object may be achieved with the features of an example embodiment of the present invention. Further advantageous specific embodiments of the present invention are disclosed herein.

A method for compensating for an influence of a magnetic interference source on a measurement of a magnetic field sensor in a device including a temperature sensor for detecting an ambient temperature, and a device are provided in accordance with example embodiments of the present invention. The device is preferably designed as a hearing device and includes a magnetic interference source, a magnetic field sensor for detecting a magnetic flux density, a temperature sensor for detecting an ambient temperature and a processing unit, which is connected to the magnetic field sensor and to the temperature sensor. The processing unit is designed to compensate for an influence of the magnetic interference source on a measurement of the magnetic field sensor in the device using the provided method.

A magnetic flux density $M_1$ measured with the magnetic field sensor at a measured ambient temperature $T_k$ is compensated for with a compensation factor $M_{interference}$ of magnetic interference source 120 according to $$M = M_1 - M_{interference},$$

where $$M_{interference} = M_0 + aM_0(T'_k - T_0)$$

and $M_0$ is a magnetic reference flux density relative to a reference temperature $T_0$, a corresponding to a material parameter, which is defined for a used magnet material of magnetic interference source 120, and the measured ambient temperature $T_k$ being corrected with the aid of a non-linear delay parameter to a temperature of magnetic interference source $T'_k$. With the aid of the provided method in accordance with the present invention, it is possible to reduce the influence on the measurement of the magnetic field sensor caused by the magnetic field of the magnetic interference source in the device. The temperature drift in the magnetic flux density of the magnetic field sensor, in particular, may be advantageously compensated for using the method. In general, the temperature effect across the magnetic field or across the magnetic flux density is examined. The accuracy and reliability of the magnetic flux density (of the magnetic field or of the magnetic field strength) compensated for by the temperature drift, which is ascertained via the provided method, may also be improved. Although the provided method on the one hand utilizes the linear correlation between magnetic field or magnetic flux density or magnetic field change or change of the magnetic flux density and temperature or temperature change, it also takes into consideration on the other hand, however, Newton's law of cooling, which results in a non-linear correlation between measured temperature change and change of the magnetic flux density or change of the magnetic field.

Newton's law of cooling states namely that a temperature change in the object (permanent magnet of the interference source) is delayed in comparison to an actual change of the measured ambient temperature. This delay results in the aforementioned non-linear correlation between the measured temperature change and the change of the magnetic field or the change of the magnetic flux density. Thus, the temperature drift may therefore be precisely compensated for and the disadvantages of the linear model in the related art are overcome. The provided method is also not limited to the compensation along a Cartesian axis, but may be used individually for multi-axis systems.

In one further specific embodiment of the present invention, a filter is implemented with the following equation $$T'_k = (1-b)T'_{k-1} + bT_k$$

for ascertaining the temperature of magnetic interference source $T'_k$, b being the delay parameter, $T_k$ being the ambient temperature and $T'_{k-1}$ being the temperature of the magnetic interference source at a preceding point in time. A correlation between a change of ambient temperature $\Delta T$ and a change of the temperature of magnetic interference source $\Delta T'$ is $$\Delta T' = g(\Delta T, b)$$

and delay parameter b is ascertained by minimizing an error from $$b = \min_b(\Delta M - aM_0(\Delta T')),$$

in this case $\Delta M$ indicating a change of the magnetic flux density. Due to the possibility of precisely modelling the non-linear relationship between the external magnetic field and the ambient temperature, it is not necessary when using the provided method to integrate a temperature sensor into or at the permanent magnet of the magnetic interference source in the device. This advantageously facilitates the manufacture of the device.

In one further specific embodiment of the present invention, material parameter a is determined individually for each Cartesian axis, in order to compensate for a position dependency of the magnetic interference source and of the magnetic field sensor in the device when measuring magnetic flux density $M_1$. In this way, a compensation of the temperature drift, in particular, may take place for each individual axis of the three-axis magnetic field sensor, which is designed, in particular, as a three-axis magnetometer. The compensation may thus be adaptively adjusted based on the measured magnetic field strength of the permanent magnet of the magnetic interference source. Accordingly, there is no limitation in the placement of the permanent magnet or of the magnetic interference source as well as of the magnetic field sensor and a high degree of flexibility for the product manufacture is provided. This may also result in a cost reduction.

In one further specific embodiment of the present invention, reference flux density $M_0$ and measured magnetic flux density $M_1$ are temporally averaged for determining material parameter a for each Cartesian axis. In this way, the accuracy may be improved and the reliability enhanced, a noise influence on the measurement may also be reduced as a result. The temporal averaging in this case may be flexibly designed and adapted to the respective requirements, for example, measured data may be averaged over 1 second, 10 seconds or alternative adjustments.

In one further specific embodiment of the present invention, material parameter a is ascertained for three Cartesian axes $(a_x\ a_y\ a_z)^T$ based on a change of the magnetic flux density in three Cartesian axes. A degree of change of the magnetic flux density $\Delta M$ is obtained from $$\Delta M = M_1 - M_0 = \sqrt{m_{1,x}^2 + m_{1,y}^2 + m_{1,z}^2} - \sqrt{m_{0,x}^2 + m_{0,y}^2 + m_{0,z}^2},$$

in this case $M_1$ indicating the measured magnetic flux density and $M_0$ the reference flux density. The change of magnetic flux density $\Delta M$ is obtained from $$\begin{bmatrix} \Delta m_x \\ \Delta m_y \\ \Delta m_z \end{bmatrix} = \begin{bmatrix} \Delta m_{1,x} \\ \Delta m_{1,y} \\ \Delta m_{1,z} \end{bmatrix} - \begin{bmatrix} \Delta m_{0,x} \\ \Delta m_{0,y} \\ \Delta m_{0,z} \end{bmatrix}$$

A projection matrix $Rot_{projection}$ $$Rot_{projection} = I_{3\times 3} + \left[\begin{bmatrix} \Delta m_x \\ \Delta m_y \\ \Delta m_z \end{bmatrix} \times \begin{bmatrix} \Delta M \\ 0 \\ 0 \end{bmatrix}\right]_x + \left[\begin{bmatrix} \Delta m_x \\ \Delta m_y \\ \Delta m_z \end{bmatrix} \times \begin{bmatrix} \Delta M \\ 0 \\ 0 \end{bmatrix}\right]_x^2 \cdot \frac{1 - \begin{bmatrix} \Delta m_x \\ \Delta m_y \\ \Delta m_z \end{bmatrix} \cdot \begin{bmatrix} \Delta M \\ 0 \\ 0 \end{bmatrix}}{\left\|\begin{bmatrix} \Delta m_x \\ \Delta m_y \\ \Delta m_z \end{bmatrix} \times \begin{bmatrix} \Delta M \\ 0 \\ 0 \end{bmatrix}\right\|^2}$$

is ascertained, in order to map the following equation $$\begin{bmatrix} \Delta m_x \\ \Delta m_y \\ \Delta m_z \end{bmatrix} = Rot_{projection} \begin{bmatrix} \Delta M \\ 0 \\ 0 \end{bmatrix}$$

and based on projection matrix $Rot_{Projection}$, to ascertain material parameter a for three Cartesian axes $(a_x\ a_y\ a_z)^T$ from $$\begin{bmatrix} a_x \\ a_y \\ a_z \end{bmatrix} = Rot_{projection} \begin{bmatrix} a \\ 0 \\ 0 \end{bmatrix}$$

The provided method renders unnecessary a need for collecting reference measuring points at various temperatures for estimating a model for the compensation of the temperature drift during the operation of the device. Thus, the temperature compensation may be directly applied for compensating for the magnetic field data without complex reference measurements. The provided specific embodiment may, in particular, be advantageously used in interference-free surroundings, in which the change of the magnetic flux density or the change of the magnetic field remains constant.

In one further specific embodiment of the present invention, material parameter a is ascertained for three Cartesian axes $(a_x\ a_y\ a_z)^T$ based on the magnetic flux density in three Cartesian axes. The magnetic flux density in three Cartesian axes is determined from reference flux density $M_0$ in three Cartesian axes $(m_{0,x}, m_{0,y}, m_{0,z})$, so that material parameter a for three Cartesian axes $(a_x\ a_y\ a_z)^T$ is obtained from $$\begin{bmatrix} a_x \\ a_y \\ a_z \end{bmatrix} = \begin{bmatrix} m_{0,x}/M_0 \\ m_{0,y}/M_0 \\ m_{0,z}/M_0 \end{bmatrix} a$$

This is based on the finding that the temperature effect on the magnetic field or on the magnetic flux density along each Cartesian axis is approximately proportional to the magnetic flux density or the magnetic field along each axis. Thus, this yields the advantage of a simple mathematical structure and thus a simplified option of implementation.

In one further specific embodiment of the present invention, an influence of a geomagnetic field on reference flux density $M_0$ in three Cartesian axes $(m_{0,x}, m_{0,y}, m_{0,z})$ may be considered. This is optional, because the geomagnetic field influences the measurement of the magnetic flux density of the magnetic field sensor significantly less than the magnetic interference source (for example, the influence is less than by approximately a factor of 30 if the magnetic flux density of the geomagnetic field is in the range of 50 µT and the measured magnetic flux density of the magnetic interference sources is approximately 1500 µT). Thus, the magnetic flux density of the geomagnetic field is negligible.

In one further specific embodiment of the present invention, material parameter a is determined for each individual axis once during an initialization of the device. The compensation of the temperature drift of the measured magnetic flux density $M_1$ is carried out continuously during an operation of the device. This allows for a defined manufacturing process with defined process steps. A controlled start-up and an optimal operation of the device may also be provided as a result. An estimate of a (without axis correction) and b may be taken into consideration once during the development of the device. For this purpose, a multiple data set, for example, i.e., a temporal data series of detected magnetic flux density and ambient temperature may be used.

The advantageous designs and refinements of the present invention explained above and/or disclosed below may—except, for example, in cases of clear dependencies or incompatible alternatives—be used individually or else also in arbitrary combination with one another.

BRIEF DESCRIPTION OF THE DRAWINGS

The above-described properties, features and advantages of the present invention and the manner in which these are achieved become more clearly and explicitly understandable in conjunction with the following description of exemplary embodiments, which are explained in greater detail in conjunction with the schematic figures.

DETAILED DESCRIPTION OF EXAMPLE EMBODIMENTS

It is noted that the figures are merely schematic in nature and are not true to scale. In this sense, components and elements shown in the figures may be represented as excessively large or reduced for better understanding. It is further noted that the reference numerals in the figures have been selected unchanged if identically designed elements and/or components are involved.

Figure 1:
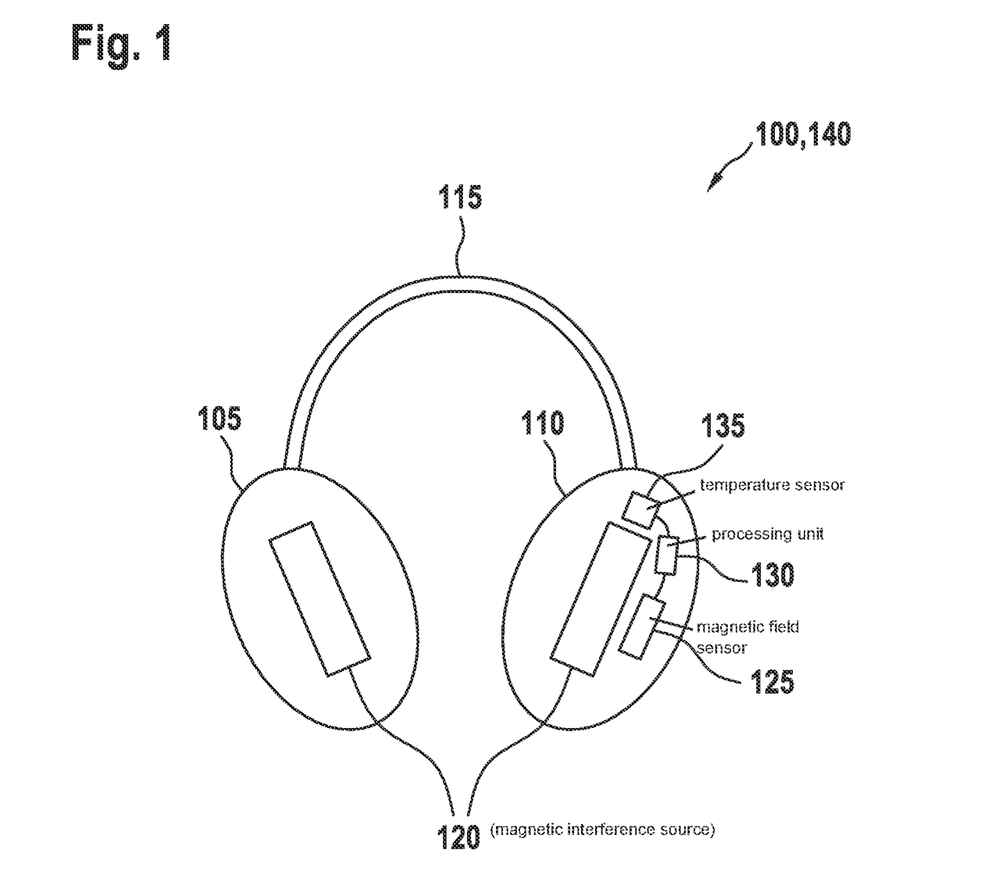
FIG. 1 schematically shows a representation of one specific embodiment of a device, in accordance with the present invention.

FIG. 1 schematically shows a representation of one specific embodiment of a device 100. Device 100 includes a magnetic interference source 120, a magnetic field sensor 125, a temperature sensor 135 and a processing unit 130. Magnetic interference source 120 produces an external magnetic field or a magnetic flux density, which influences the measurement of magnetic field sensor 125. Temperature sensor 135, as depicted, is not attached at or in magnetic interference source 120, thus, temperature sensor 135 is designed to detect the ambient temperature prevailing in the surroundings of device 100. Temperature sensor 135 is connected via processing unit 130 to magnetic field sensor 125. Processing unit 130 is designed to process measured data of temperature sensor 135 and of magnetic field sensor 125. In addition, processing unit 130 is designed to carry out the provided method for compensating for the influence of magnetic interference source 120 in device 100 and to determine from the measured data the parameters necessary for the compensation and to provide a value of the compensated magnetic flux density for device 100, for example, to calculate based thereon, directions for an audio-guided navigation of device 100.

Device 100 in FIG. 1 is designed, for example, as a hearing device 140, hearing device 140 represented being depicted by way of example as a headset. Hearing device 140 may, however, also have an alternative design. Hearing device 140 includes a first headphone 105 and a second headphone 110, first headphone 105 and second headphone 110 each including magnetic interference source 120, which are designed, for example, as loudspeaker permanent magnets of hearing device 140. First headphone 105 and second headphone 110 are connected to one another via a headband 115. Thus, with device 100 depicted, the ambient temperature may be determined with the aid of temperature sensor 135 and not directly a magnet temperature of the permanent magnet of magnetic interference source 120.

Figure 2A:
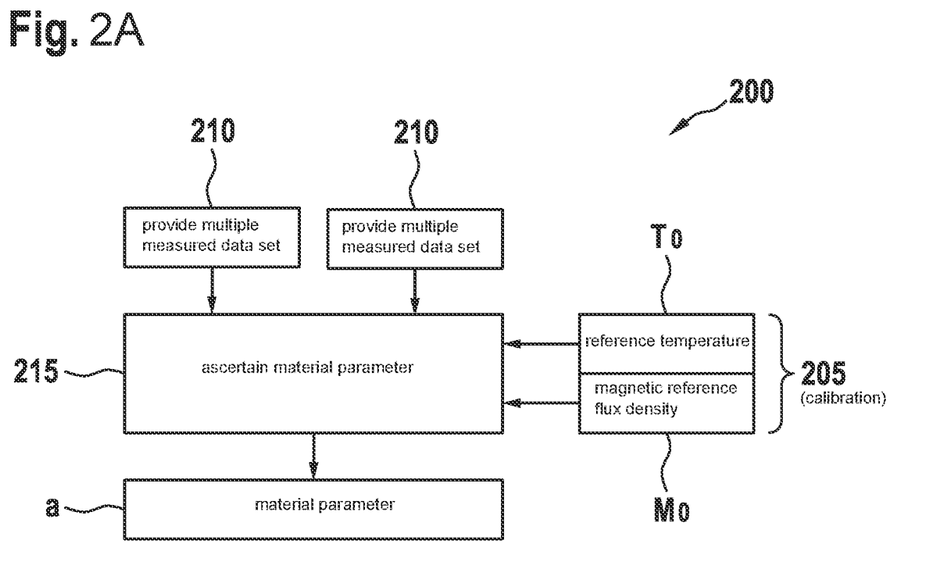
FIG. 2A schematically shows a representation of a first specific embodiment of a provided method for a device according to FIG. 1, in accordance with the present invention.

Temperature fluctuations or temperature changes are generally expressed in such devices 100 via the magnetic flux density or the change of the magnetic flux density or the magnetic field or the change of the magnetic field (i.e., the magnetic field strength or the change of the magnetic field strength). FIG. 2A shows a method 200 for compensating for an influence of magnetic interference source 120 on a measurement of magnetic field sensor 125 in device 100 in FIG. 1 according to one first specific embodiment. In this case, method 200 in FIG. 2A maps the steps required for determining a material parameter a, which is defined for a used magnet material of magnetic interference source 120 and describes a correlation between magnetic flux density or magnetic field and temperature. Method 200 as well as the following described methods are carried out, for example, by processing unit 130 in FIG. 1. A relationship between a change of the magnetic flux density (change of the magnetic field) and a change of the temperature may be approximated as a linear model, provided via the following mathematical correlation (1)

$$M_k - M_0 = aM_0(T_k - T_0)$$

in this case $T_0$ corresponding to a reference temperature, which is selected, for example, as room temperature at 20° C. or 25° C. and $M_0$ corresponding to a reference flux density for reference temperature $T_0$, $T_k$ and $M_k$ being the magnet temperature and the magnetic flux density at point in time k, and a indicating the material parameter for the used magnet material.

In this case, material parameter a is independent of the mounting and placement of the permanent magnet of interference source 120, not, however, reference flux density $M_0$. Even when using the same permanent magnet with the same magnet material, the results are only minimal mounting and placement deviations of the permanent magnet in a magnetic reference flux density $M_0$ deviating under constant temperature. For this reason, the linear increase is generally divided into a constant value for material parameter a and a variable value for reference flux density $M_0$.

Accordingly, a calibration of the measurement of magnetic reference flux density $M_0$ by magnetic field sensor 125 in FIG. 1 to the aforementioned reference temperature $T_0$ initially takes place in a first method step 205 in FIG. 2A.

In a second method step 210, a multiple measured data set is provided. The multiple measured data set includes, for example, a large number of measurements of the ambient temperature with the aid of temperature sensor 135 and a large number of measurements of the magnetic flux density with the aid of magnetic field sensor 125 in FIG. 1. This means, the variables $T_k$ and $M_k$ in equation 1 now map an entire time series of various points in time k. In a third method step 215, material parameter a is ascertained based on first and second method step 205, 210 according to the following equation (2)

$$a = \frac{M - M_0}{M_0(T - T_0)}$$

In this case, M and T correspond to the multiple measured data set provided in second method step 210.

Figure 2B:
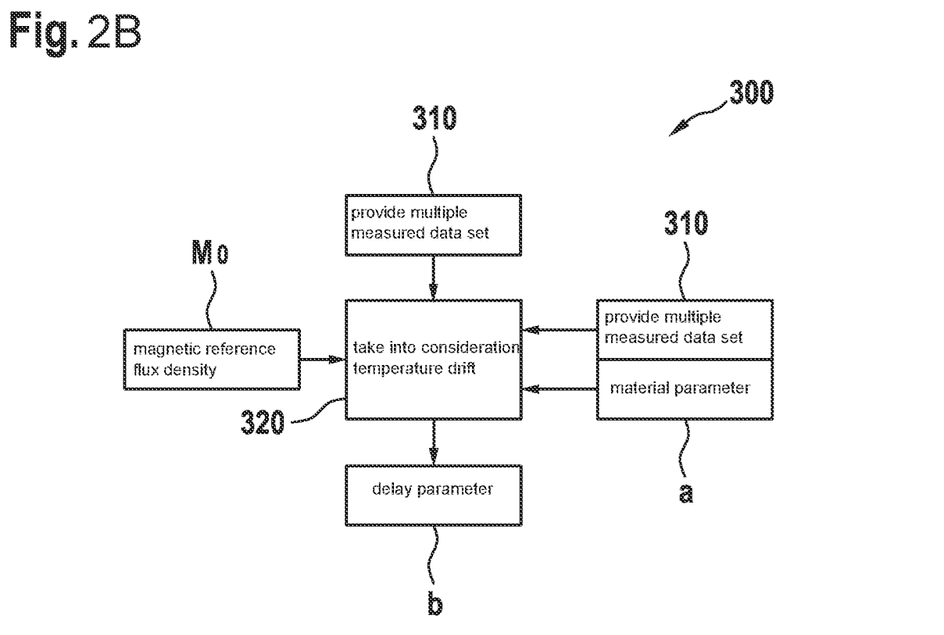
FIG. 2B schematically shows a second specific embodiment of a provided method for a device according to FIG. 1, in accordance with the present invention.

Since, however, a correlation between the magnetic flux density or a change of the magnetic flux density (the magnetic field or the magnetic field strength or the change of the magnetic field or the change of the magnetic field strength) and the temperature or the change of the temperature in equations 1 and 2 in each case references the magnet temperature, it is necessary to initially convert the measured ambient temperature (or the time series of measured ambient temperature values) into the magnet temperature of the magnetic interference source 120, in order to be able to further correctly apply the linear correlation of the variables in the aforementioned equations. This approach is schematically represented in FIG. 2B, by adding a non-linear delay according to Newton's law of cooling. FIG. 2B shows a method 300 according to one second specific embodiment, in which, similar to second method step 210 of method 200 in FIG. 2A, a multiple measured data set is provided in a first method step 310. In this case, the multiple measured data set may be designed similarly as explained above. In a second method step 320 in FIG. 2B, a temperature drift of a measured magnetic flux density across a temperature-dependent delay parameter is taken into consideration. This delay parameter indicates, in particular, a non-linear correlation between the measured ambient temperature and magnet temperature $T'_k$ and is ascertained based on material parameter a, which has been obtained from third method step 215 in FIG. 2A.

To ascertain the temperature of magnetic interference source $T'_k$, a filter is implemented with the following equation (3)

$$T'_k = (1-b)T'_{k-1} + bT_k$$

b corresponding in this case to the delay parameter, $T_k$ corresponding to the ambient temperature and $T'_k$ corresponding to the magnet temperature at point in time k, and $T'_{k-1}$ corresponding to the magnet temperature at a preceding point in time. The filter is designed, for example, as an exponential filter or as an IIR filter (IIR: Infinite Impulse Response). A correlation between a change of ambient temperature $\Delta T$ and a change of the temperature of magnetic interference source $\Delta T'$ may be formulated with the aid of equation (4)

$$\Delta T' = g(\Delta T, b).$$

Delay parameter b in FIG. 2B may be ascertained by minimizing an error from equation (5)

$$b = \min_b(\Delta M - aM_0(\Delta T'))$$

$\Delta M$ indicating a change of the magnetic flux density and $M_0$ referring to the aforementioned reference flux density.

Methods 200, 300 FIGS. 2A and 2B are carried out only once, for example, during the development or during the manufacture of device 100 in FIG. 1. Material parameter a and delay parameter b, in particular, each have constant values for a particular magnetic material of magnetic interference source 120 and of a fixed positioning of temperature sensor 135 in FIG. 1 with respect to permanent magnets of magnetic interference source 120. These constant values are utilized as input variables for subsequent calculations.

Figure 2C:
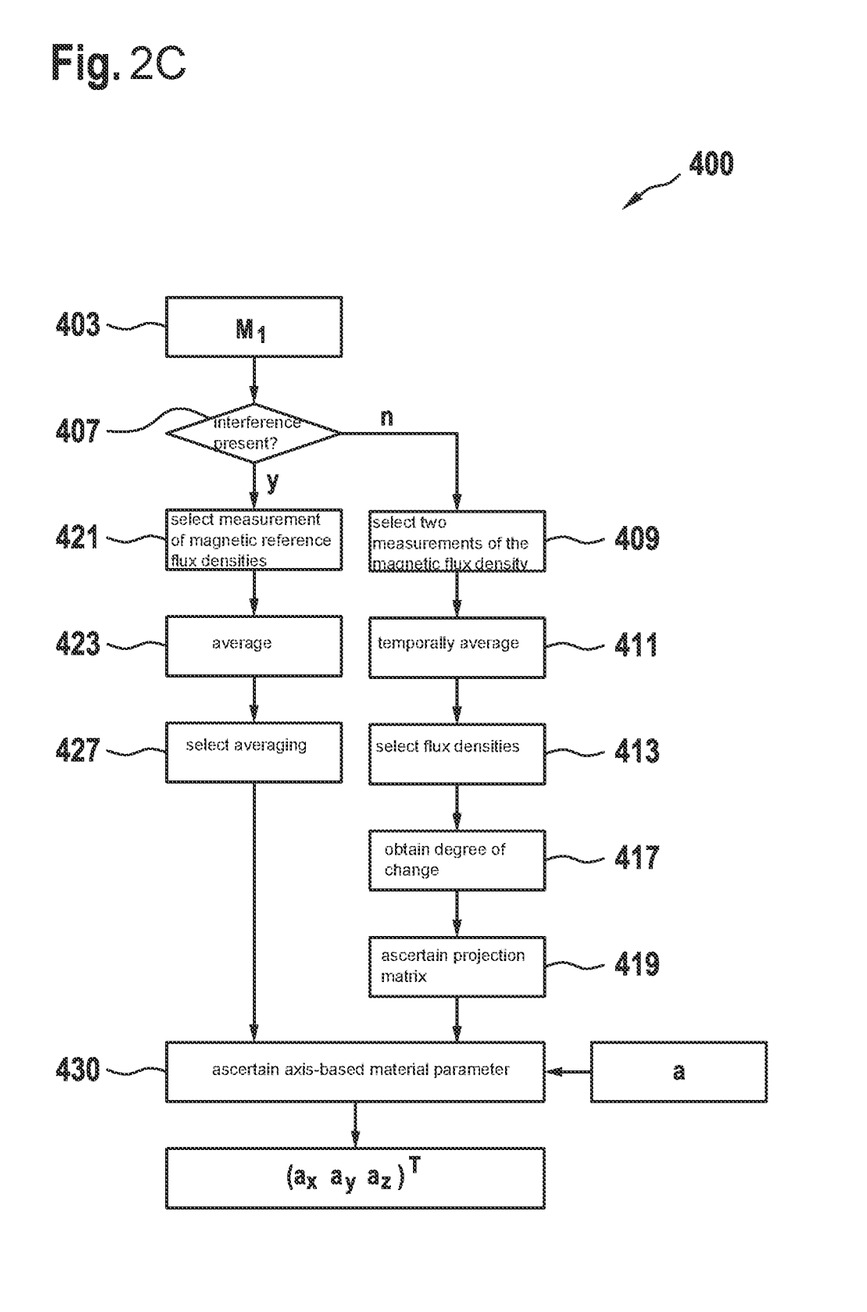
FIG. 2C schematically shows a representation of a third specific embodiment of a provided method for a device according to FIG. 1, in accordance with the present invention.

FIG. 2C shows a method 400 according to one third specific embodiment, in which material parameter a is determined individually for each Cartesian axis of three-axis magnetic field sensor 125 in order to compensate for a position dependency of magnetic interference source 120 and of magnetic field sensor 125 in device 100 in FIG. 1 during the measurement of a magnetic flux density $M_1$. This position dependency may result in the measured flux density (or field strength) varying depending on the placement of interference source 120 or of sensor 125. The material parameter ascertained with the aid of method 200 in FIG. 2A is a function only of the magnet material and once designed device 100 is finished, the material parameter determined with method 200 is suitable for all devices 100 of the same model. However, the temperature drift for each axis may only be considered by ascertaining material parameter a for each Cartesian axis and this determination must take place individually for each device 100, since there is no standard axis-dependent material parameter a for all devices of a model. To ascertain the axis-based material parameter, two different methods may be utilized, which are explained in FIG. 2C, one method being based on a change of the magnetic flux density in three axes and the other method being based on the magnetic flux density in three axes.

A first method step 403 in FIG. 2C forms the provision of the measured magnetic flux density $M_1$. In a second method step 407, processing unit 130 in FIG. 1 checks whether an interference of the surroundings is present. This may manifest itself, for example, in an additional influencing of a degree of the change of the magnetic flux density (change of the degree of the magnetic field), so that this interference is no longer able to reflect a temperature change alone. It is therefore checked whether or not the magnetic flux density (or whether the magnetic field strength) changes. In interference-free surroundings, in particular, the magnetic flux density (the magnetic field strength) remains constant. If no interference is present, which is indicated by an n, then the material parameter is ascertained for three Cartesian axes $(a_x, a_y, a_z)^T$ based on the change of the magnetic flux density in three Cartesian axes. For this purpose, two measurements of the magnetic flux density are selected in a third method step 409 at various ambient temperatures, for example, reference flux density $M_0$ at temperature $T_0$ $[m_{0,x}, m_{0,y}, m_{0,z}]^T$ for one, and magnetic flux density ($M_1$ at temperature $T_1$ $[m_{1,x}, m_{1,y}, m_{1,z}]^T$, $T_1$ being different from $T_0$.

In a fourth method step 411, the measured magnetic flux densities are temporally averaged in order, for example, to reduce the noise influence. For example, the averaging time may be 1 second. In a fifth method step 413, the aforementioned flux densities are selected, where the orientation of device 100 therefor should not be changed, so that the geomagnetic field along the Cartesian axes does not change and is correctable by subtraction. In a sixth method step 417, a degree of the change of magnetic flux density $\Delta M$ is obtained from equation (6)

$$\Delta M = M_1 - M_0 = \sqrt{m_{1,x}^2 + m_{1,y}^2 + m_{1,z}^2} - \sqrt{m_{0,x}^2 + m_{0,y}^2 + m_{0,z}^2}$$

$M_1$ corresponding in this case to the measured flux density and $M_0$ corresponding to the reference flux density.

The change of magnetic flux density $\Delta M$ in three Cartesian axes is obtained from equation (7)

$$\begin{bmatrix} \Delta m_x \\ \Delta m_y \\ \Delta m_z \end{bmatrix} = \begin{bmatrix} \Delta m_{1,x} \\ \Delta m_{1,y} \\ \Delta m_{1,z} \end{bmatrix} - \begin{bmatrix} \Delta m_{0,x} \\ \Delta m_{0,y} \\ \Delta m_{0,z} \end{bmatrix}$$

In a seventh method step 419, a projection matrix $Rot_{Projection}$ is ascertained according to equation (8)

$$Rot_{projection} = I_{3\times 3} + \left[\left[\begin{array}{c}\Delta m_x\\ \Delta m_y\\ \Delta m_z\end{array}\right]x\left[\begin{array}{c}\Delta M\\ 0\\ 0\end{array}\right]\right]_x + \left[\left[\begin{array}{c}\Delta m_x\\ \Delta m_y\\ \Delta m_z\end{array}\right]x\left[\begin{array}{c}\Delta M\\ 0\\ 0\end{array}\right]\right]_x^2 \cdot \frac{1 - \left[\begin{array}{c}\Delta m_x\\ \Delta m_y\\ \Delta m_z\end{array}\right]\cdot\left[\begin{array}{c}\Delta M\\ 0\\ 0\end{array}\right]}{\left\|\left[\begin{array}{c}\Delta m_x\\ \Delta m_y\\ \Delta m_z\end{array}\right]x\left[\begin{array}{c}\Delta M\\ 0\\ 0\end{array}\right]\right\|^2},$$

$I_{3\times 3}$ corresponding to the unit matrix, $[\ ]_x$ indicating the notation for the corresponding cross product matrix, in order to map the following equation (9)

$$\left[\begin{array}{c}\Delta m_x\\ \Delta m_y\\ \Delta m_z\end{array}\right] = Rot_{projection}\left[\begin{array}{c}\Delta M\\ 0\\ 0\end{array}\right]$$

and to ascertain in an eighth method step 430 material parameter a for three Cartesian axes $(a_x, a_y, a_z)$ from equation (10)

$$\left[\begin{array}{c}a_x\\ a_y\\ a_z\end{array}\right] = Rot_{projection}\left[\begin{array}{c}a\\ 0\\ 0\end{array}\right]$$

based on projection matrix $Rot_{Projection}$. In this case, material parameter a, which has been ascertained with the aid of method 200 in FIG. 2A, is used for the calculation.

A ninth method step 421 in FIG. 2C indicates the calculation method in interfered surroundings (indicated by y). In this case, the degree of change of magnetic flux density $\Delta M$ or the change of the magnetic flux density (or the degree of change of the magnetic field strength or the change of the magnetic field strength) is influenced, for example, by an additional magnetic interference. In ninth method step 421, a measurement of magnetic reference flux densities $(m_{0,x}, m_{0,y}, m_{0,z})^T$ is therefore selected and these are averaged in a tenth method step 423, for example, also for an averaging duration of 1 second. This averaging is selected in an eleventh method step 427 in order to ascertain axis-based material parameter a for three Cartesian axes $(a_x\ a_y\ a_z)^T$ in eighth method step 430 from equation (11)

$$\left[\begin{array}{c}a_x\\ a_y\\ a_z\end{array}\right] = \left[\begin{array}{c}m_{0,x}/M_0\\ m_{0,y}/M_0\\ m_{0,z}/M_0\end{array}\right]a$$

The selected magnetic reference flux density $(m_{0,x}, m_{0,y}, m_{0,z})^T$ may be influenced by the geomagnetic field, which may result in a strengthening of the temperature effect. Assuming the magnetic flux density in the z direction, $m_{0,z}$ without the geomagnetic field has a magnetic reference flux density of half the geomagnetic field, so that $m_{0,z}$ may be written (equation 12) as follows $$m_{0,z} = \frac{|m_{earth}|}{2}$$

Device 100 in FIG. 1 is then moved into a particular orientation, so that the entire geomagnetic field is added with an opposite sign to the above equation, so that $m_{0,z}$ $$m_{0,z} = -\frac{|m_{earth}|}{2}$$

includes half the amount of the geomagnetic field or of the magnetic flux density of the geomagnetic field, but with a minus sign. If this result is inserted into the projection matrix, then a strengthening rather than a compensation of the temperature effect in the z direction takes place due to the changed sign. However, since the geomagnetic field or the magnetic flux density of the geomagnetic field is considered to be small (compared to the magnetic interference source, for example, small by a factor of 30), then the strengthening as a result of the minus sign continues to be negligibly small and may accordingly be disregarded.

Figure 3:
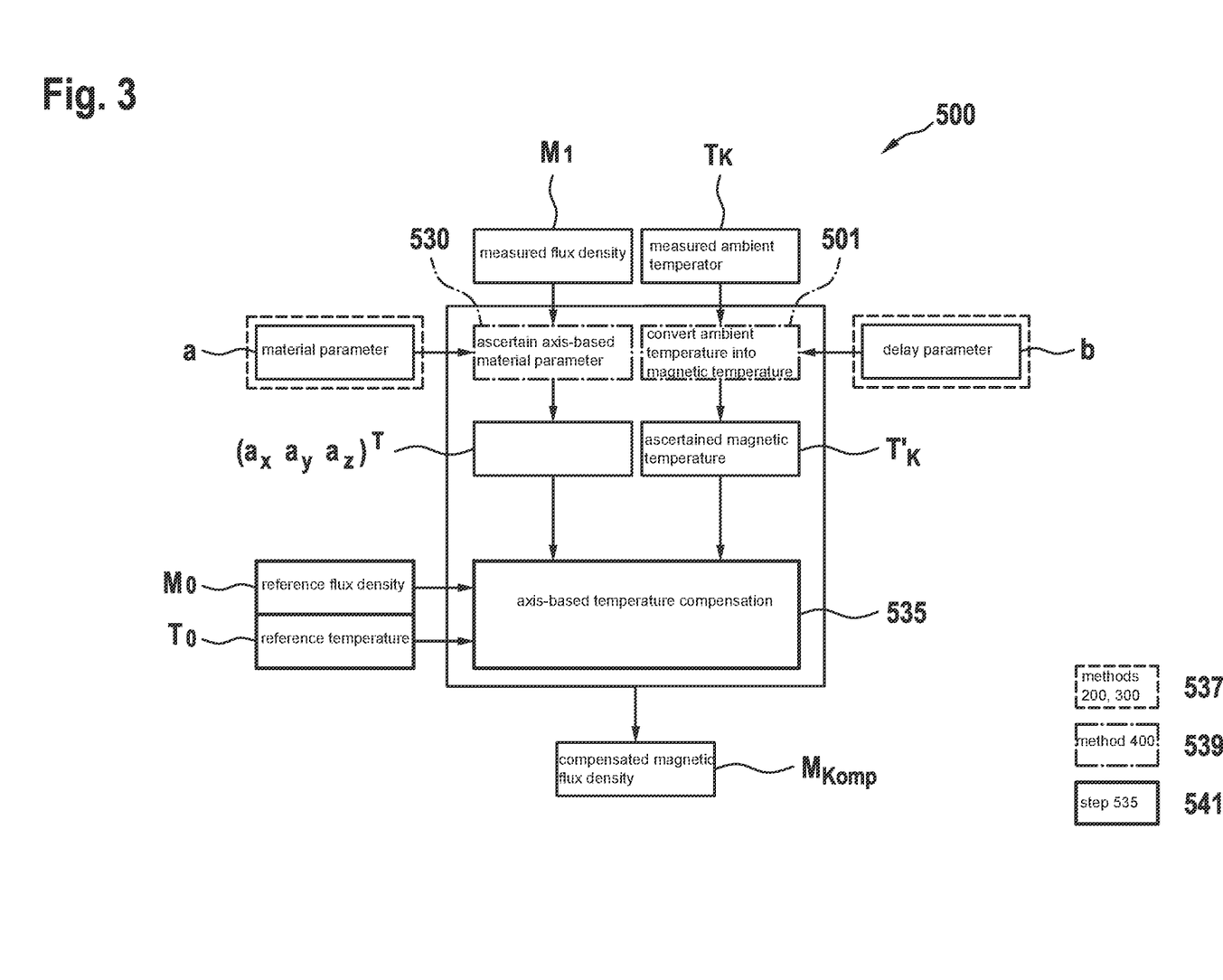
FIG. 3 schematically shows a fourth specific embodiment of a provided method for a device according to FIG. 1, in accordance with the present invention.

One method according to a fourth specific embodiment 500 in FIG. 3 shows the combination of previous methods 200, 300, 400 and expands these by additional steps, in order to ascertain the magnetic flux density $M_{Komp}$ compensated by the temperature drift and to be able to provide device 100 as the output variable in FIG. 1 for further processing. Methods 200 and 300 in FIGS. 2A and 2B in this case form, for example, a first calculation step 537 in FIG. 3 and method 400 in FIG. 2C forms a second calculation step 539 in FIG. 3. In a first method step 501, ambient temperature $T_k$ is converted into magnet temperature $T'_k$, based on delay parameter b ascertained in first calculation step 537 in method 300.

A second method step 530 is designed similarly to eighth method step 430 in FIG. 2C and includes the ascertainment of axis-based material parameter a for three Cartesian axes $(a_x\ a_y\ a_z)^T$ according to the above calculation methods. Based thereon, and on ascertained magnet temperature $T'_k$, processing unit 130 in FIG. 1 carries out the axis-based temperature compensation in a third method step 535 in FIG. 3. Third method step 535 thus forms a third calculation step 541 in FIG. 3 on the basis of reference flux density $M_0$ and reference temperature $T_0$.

The idea of compensation involves "resetting" or "moving" the drifted magnetic flux density or the drifted magnetic field to a reference level, which is defined by given reference temperature $T_0$. This means that the drifted magnetic flux density (or the drifted magnetic field) is reset after the compensation to the corresponding value of the magnetic flux density (value of the magnetic field or value of the magnetic field strength), in which the temperature corresponds to reference temperature $T_0$, i.e., for example, 20° C. or 25° C. With the aid of reference temperature $T_0$ and reference flux density $M_0$, it is possible to determine magnetic flux density $M_{Komp}$ compensated by the temperature drift as follows for the Cartesian axes $$m_{Komp,x} = m_{1,x} - a_x M_0 (T'_k - T_0),$$

$$m_{Komp,y} = m_{1,y} - a_y M_0 (T'_k - T_0),$$

$$m_{Komp,z} = m_{1,z} - a_z M_0 (T'_k - T_0).$$

The present invention has been described in detail with the aid of preferred exemplary embodiments. Instead of the exemplary embodiments described, further exemplary embodiments are possible, which may include additional modifications or combinations of described features. For this reason, the present invention is not restricted by the examples described, since other variations may be derived therefrom by those skilled in the art without departing from the scope of protection of the present invention in the process.

What is claimed is:

1. A method for compensating for an influence of a magnetic interference source on a measurement of a magnetic field sensor in a device including a temperature sensor configured to detect an ambient temperature, the method comprising the following steps:

compensating, for a magnetic flux density M1 measured with the magnetic field sensor at a measured temperature Tk, with a compensation factor $M_{interference}$ of the magnetic interference source according to $$M = M_1 - M_{interference}$$

where $$M_{interference} = M_0 + aM_0(T'_k - T_0)$$

and Mo is a magnetic reference flux density relative to a reference temperature To, a corresponds to a material parameter which is defined for a used magnet material of the magnetic interference source, and the measured ambient temperature Tk being corrected to a temperature of the magnetic interference source T'k using a non-linear delay parameter;

wherein the device is a hearing device.

2. The method as recited in claim 1, wherein a filter is implemented with the following equation for ascertaining the temperature of the magnetic interference source $T'_k$ $$T'_k = (1-b)T'_{k-1} + bT_k$$

b being the delay parameter, $T_k$ being the ambient temperature and $T'_{k-1}$ being the temperature of the magnetic interference source at a preceding point in time, and a correlation between a change of the ambient temperature ΔT and a change of the temperature of the magnetic interference source ΔT' being $$\Delta T' = g(\Delta T, b),$$

and the delay parameter b being ascertained by minimizing an error from $$b = \min_b(\Delta M - aM_0(\Delta T'))$$

and ΔM indicating a change of the magnetic flux density.

3. The method as recited in claim 1, wherein the material parameter a is determined individually for each Cartesian axis to compensate for a position dependency of the magnetic interference source and of the magnetic field sensor in the device in the measurement of the magnetic flux density $M_1$.

4. The method as recited in claim 3, wherein the reference flux density $M_0$ and the measured magnetic flux density $M_1$ are temporally averaged for determining the material parameter a for each Cartesian axis.

5. The method as recited in claim 3, wherein the material parameter a for three Cartesian axes $(a_x\ a_y\ a_z)^T$ is ascertained based on a change of the magnetic flux density in three Cartesian axes, an absolute value of change of the magnetic flux density ΔM being obtained from $$\Delta M = M_1 - M_0 = \sqrt{m_{1,x}^2 + m_{1,y}^2 + m_{1,z}^2} - \sqrt{m_{0,x}^2 + m_{0,y}^2 + m_{0,z}^2},$$

and indicating the measured magnetic flux density $M_1$ and the reference flux density $M_0$, the change of the magnetic flux density ΔM in three Cartesian axes being obtained from $$\begin{bmatrix} \Delta m_x \\ \Delta m_y \\ \Delta m_z \end{bmatrix} = \begin{bmatrix} \Delta m_{1,x} \\ \Delta m_{1,y} \\ \Delta m_{1,z} \end{bmatrix} - \begin{bmatrix} \Delta m_{0,x} \\ \Delta m_{0,y} \\ \Delta m_{0,z} \end{bmatrix},$$

a projection matrix RotProjection $$Rot_{projection} = I_{3\times 3} + \left[\begin{bmatrix} \Delta m_x \\ \Delta m_y \\ \Delta m_z \end{bmatrix} x \begin{bmatrix} \Delta M \\ 0 \\ 0 \end{bmatrix}\right]_x + \left[\begin{bmatrix} \Delta m_x \\ \Delta m_y \\ \Delta m_z \end{bmatrix} x \begin{bmatrix} \Delta M \\ 0 \\ 0 \end{bmatrix}\right]_x^2 \cdot \frac{1 - \begin{bmatrix} \Delta m_x \\ \Delta m_y \\ \Delta m_z \end{bmatrix} \cdot \begin{bmatrix} \Delta M \\ 0 \\ 0 \end{bmatrix}}{\left\|\begin{bmatrix} \Delta m_x \\ \Delta m_y \\ \Delta m_z \end{bmatrix} x \begin{bmatrix} \Delta M \\ 0 \\ 0 \end{bmatrix}\right\|^2}$$

being ascertained to map the following equation $$\begin{bmatrix} \Delta m_x \\ \Delta m_y \\ \Delta m_z \end{bmatrix} = Rot_{projection} \begin{bmatrix} \Delta M \\ 0 \\ 0 \end{bmatrix}$$

and, based on the projection matrix RotProjection, ascertaining the material parameter a for three Cartesian axes $(a_x\ a_y\ a_z)^T$ from $$\begin{bmatrix} a_x \\ a_y \\ a_z \end{bmatrix} = Rot_{projection} \begin{bmatrix} a \\ 0 \\ 0 \end{bmatrix}.$$

6. The method as recited in claim 3, wherein the material parameter a is ascertained for three Cartesian axes $(a_x\ a_y\ a_z)^T$ based on the magnetic flux density in three Cartesian axes, the magnetic flux density in three Cartesian axes being determined from the reference flux density $M_0$ in three Cartesian axes $(m_{0,x}, m_{0,y}, m_{0,z})$, the material parameter a for three Cartesian axes $(a_x\ a_y\ a_z)^T$ being obtained from $$\begin{bmatrix} a_x \\ a_y \\ a_z \end{bmatrix} = \begin{bmatrix} m_{0,x}/M_0 \\ m_{0,y}/M_0 \\ m_{0,z}/M_0 \end{bmatrix} a.$$

7. The method as recited in claim 6, wherein an influence of a geomagnetic field on the reference flux density $M_0$ in three Cartesian axes $(m_{0,x}, m_{0,y}, m_{0,z})$ is taken into consideration.

8. The method as recited in claim 3, wherein the material parameter a is determined for each individual Cartesian axis once during an initialization of the device, and the compensation of the temperature drift of the measured magnetic flux density $M_1$ being continuously carried out during an operation of the device.

9. A device, comprising:
a magnetic interference source;
a magnetic field sensor configured to detect a magnetic flux density;
a temperature sensor configured to detect an ambient temperature; and a processor, which is connected to the magnetic field sensor and to the temperature sensor, the processor being configured to compensate for an influence of the magnetic interference source on a measurement of the magnetic field sensor in the device, the processor being configured to:

compensate, for a magnetic flux density M1 measured with the magnetic field sensor at a measured temperature Tk, with a compensation factor Minterference of the magnetic interference source according to $$M = M_1 - M_{interference}$$

where $$M_{interference} = M_0 + aM_0(T'_k - T_0)$$

and Mo is a magnetic reference flux density relative to a reference temperature To, a corresponds to a material parameter which is defined for a used magnet material of the magnetic interference source, and the measured ambient temperature Tk being corrected to a temperature of the magnetic interference source T'k using a non-linear delay parameter;

wherein the device is a hearing device.

* * * * *